(12) United States Patent
Sakuma et al.

(10) Patent No.: US 12,308,600 B2
(45) Date of Patent: May 20, 2025

(54) LIGHT SOURCE APPARATUS AND INSPECTION APPARATUS

(71) Applicant: Lasertec Corporation, Kanagawa (JP)

(72) Inventors: Jun Sakuma, Yokohama (JP); Akihiro Ando, Yokohama (JP)

(73) Assignee: LASERTEC CORPORATION, Yokohama (JP)

( * ) Notice: Subject to any disclaimer, the term of this patent is extended or adjusted under 35 U.S.C. 154(b) by 591 days.

(21) Appl. No.: 17/664,183

(22) Filed: May 19, 2022

(65) Prior Publication Data

US 2022/0376458 A1 Nov. 24, 2022

(30) Foreign Application Priority Data

May 21, 2021 (JP) .................................. 2021-085860
Apr. 14, 2022 (JP) .................................. 2022-066787

(51) Int. Cl.

| | | |
|---|---|---|
| *G02F 1/355* | (2006.01) | |
| *H01S 3/081* | (2006.01) | |
| *H01S 3/10* | (2006.01) | |
| *H01S 3/108* | (2006.01) | |
| *H01S 3/109* | (2006.01) | |
| *H01S 5/14* | (2006.01) | |

(Continued)

(52) U.S. Cl.
CPC ........ *H01S 3/10053* (2013.01); *G02F 1/3551* (2013.01); *H01S 3/0816* (2013.01); *H01S 3/108* (2013.01); *H01S 3/109* (2013.01); *H01S 5/14* (2013.01); *H01L 22/12* (2013.01); *H01S 3/0085* (2013.01)

(58) Field of Classification Search
CPC .... H01S 3/0085; H01S 3/10053; H01S 3/108; H01S 3/109; G02F 1/3351
See application file for complete search history.

(56) References Cited

U.S. PATENT DOCUMENTS 5,339,324 A * 8/1994 Eguchi ...................... G02F 1/37
372/18
5,367,531 A * 11/1994 Eguchi ...................... G02F 1/37
372/98

(Continued)

FOREIGN PATENT DOCUMENTS

JP H05243661 A 9/1993
JP H09121069 A 5/1997

(Continued)

*Primary Examiner* — Michael Carter
(74) *Attorney, Agent, or Firm* — McCoy Russell LLP

(57) ABSTRACT

A decrease of an output of a wavelength converted light converted by a nonlinear optical crystal is suppressed. A light source apparatus according to the present disclosure includes a fundamental wave light source configured to generate a fundamental wave which is a continuous oscillation laser beam, an external cavity including a plurality of optical mirrors, a nonlinear optical crystal installed inside the external cavity and configured to generate a light with a wavelength shorter than that of the fundamental wave. The light source apparatus includes at least one phase modulator disposed between the fundamental wave light source and the external cavity and configured to modulate the fundamental wave by a modulation frequency of an integer multiple of a resonance frequency interval of the external cavity.

8 Claims, 13 Drawing Sheets

(51) Int. Cl.
   *H01L 21/66*    (2006.01)
   *H01S 3/00*    (2006.01)

(56) References Cited

U.S. PATENT DOCUMENTS 5,696,780 A    12/1997  Pieterse et al.
5,832,009 A    11/1998  Kikuchi

FOREIGN PATENT DOCUMENTS

JP    3309430 B2    5/2002
JP    2007163893 A    6/2007

\* cited by examiner

| L (m) | 0.6 | | |
|---|---|---|---|
| c (m/s) | 300,000,000 | | |
| c/L (Hz) | 500,000,000 | | |
| N | 599,999 | 600,000 | 600,001 |
| λ (m) | 0.0000010000167 | 0.0000010000000 | 0.00000099999833 |
| υ (Hz) | 299,999,500,000,000 | 300,000,000,000,000 | 300,000,500,000,000 |

Fig. 9

LIGHT SOURCE APPARATUS AND INSPECTION APPARATUS

CROSS-REFERENCE TO RELATED APPLICATIONS

The present application claims priority to Japanese Patent Application No. 2021-085860, filed on May 21, 2021, and to Japanese Patent Application No. 2022-066787, filed on Apr. 14, 2022. The entire contents of the above-listed applications are hereby incorporated by reference for all purposes.

TECHNICAL FIELD

The present disclosure relates to a light source apparatus and an inspection apparatus.

BACKGROUND

It is known that a nonlinear optical crystal is disposed inside an external cavity and wavelength conversion is performed with high efficiency by utilizing an interference effect. In such a case, a single frequency laser beam (longitudinal single mode) is commonly made incident on the nonlinear optical crystal. By controlling a length of an external cavity to an integer multiple of a wavelength of the single frequency laser beam by using an actuator, interference is maintained and a wavelength converted light of continuous oscillation is generated (for example, see Japanese Patent No. 3309430). A technique for converting a wavelength of a laser beam other than a single frequency laser beam by an external cavity has also been proposed. For example, U.S. Pat. No. 5,696,780 discloses a technique for generating a light with little noise by converting wavelengths of as many as a few hundred longitudinal multimode laser beams.

It is known that when a single frequency laser beam is incident on a nonlinear optical crystal, the inside of the crystal is degraded by the energy of a generated ultraviolet light, and the output power decreases with time. In an extreme case, a periodic refractive index distribution is generated inside the crystal, a transmission type diffraction grating is formed, and a fundamental wave circulating inside a cavity is reflected and reversely circulates (see Japanese Unexamined Patent Application Publication No. 2007-163893). When the reversely circulated light returns to a laser light source, the fundamental wave becomes unstable, the single frequency oscillation is disturbed, and multiple frequency oscillation occurs, and the output of the ultraviolet light may be greatly reduced. The degradation of the inside of the crystal limits the output of the generated light and thus becomes a factor that impairs the reliability of the light source.

The single frequency laser oscillation is configured in such a way that only the light of one mode is oscillated by increasing a loss of a light of other mode, by a wavelength selection element or the like, in a longitudinal mode in which a laser can be oscillated within a gain of the laser. However, when a light such as a reflected light enters from an external optical part, the oscillation may be disturbed and the oscillation of a single frequency may not be maintained. Therefore, an optical isolator is installed on an optical path in order to suppress a reflected light, but the optical isolator alone may not completely prevent the incident light from entering from the outside in some cases.

On the other hand, the PDH (Pound Drever Hall) method, which is also referred to as the FM sideband method, and the Hansch Couillaud method are commonly used for controlling a cavity length. In the PDH method, an error signal is generated by modulating a laser beam serving as a fundamental wave with a phase modulator. In such a case, the modulation frequency of the phase modulator is commonly set to about 5 to 20% of the frequency interval (FSR: Free Spectral Range) of the external cavity. The degree of modulation of the phase modulator is set to a small value (e.g., less than 0.5) so that the power loss of a carrier wave whose wavelength is to be converted becomes small (see, for example, Japanese Unexamined Patent Application Publication No. H05-243661).

Japanese Unexamined Patent Application Publication No. H09-121069 discloses a technique for reducing the overcoherence of a laser beam by using a phase modulator. Note that the degradation of the nonlinear optical crystal described above is not mentioned in Japanese Unexamined Patent Application Publication No. H09-121069.

SUMMARY

As described above, there has been a problem that an output of a nonlinear optical crystal decreases with time due to the energy of the ultraviolet light. As a solution to this problem, Japanese Unexamined Patent Application Publication No. 2007-163893 proposes, for example, methods of (1) changing a center wavelength of laser, (2) changing a temperature of a nonlinear optical crystal, (3) applying stress to the nonlinear optical crystal, and (4) irradiating the nonlinear optical crystal with an ultraviolet light. However, the methods (1) and (2) have a fatal defect in which the phase matching condition, the most important condition in wavelength conversion, is not satisfied, making practical application extremely difficult. In addition, the specific configuration of the methods (3) and (4) is unknown, and thus it cannot be confirmed whether the methods (3) and (4) are effective.

The present disclosure has been made in order to solve such a problem, and provides a light source apparatus and an inspection apparatus for suppressing a decrease of an output of a wavelength converted light converted by a nonlinear optical crystal.

A light source apparatus according to the present disclosure includes:
- a fundamental wave light source configured to generate a fundamental wave, the fundamental wave being a continuous oscillation laser beam;
- an external cavity including a plurality of optical mirrors;
- a nonlinear optical crystal installed inside the external cavity and configured to generate a light having a wavelength shorter than that of the fundamental wave; and
- at least one phase modulation means disposed between the fundamental wave light source and the external cavity and configured to modulate the fundamental wave by a modulation frequency of an integer multiple of a resonance frequency interval of the external cavity.

Further, an inspection apparatus according to the present disclosure irradiates a sample with the light generated by the light source apparatus.

According to the present disclosure, it is possible to provide a light source apparatus and an inspection apparatus for suppressing a decrease of an output of a wavelength converted light converted by a nonlinear optical crystal.

The above and other objects, features and advantages of the present disclosure will become more fully understood from the detailed description given hereinbelow and the

BRIEF DESCRIPTION OF THE FIGURES

FIG. 9 shows a calculation result of a resonance frequency in an external cavity according to the first embodiment;

DETAILED DESCRIPTION

A specific configuration of this embodiment will be described below with reference to the drawings. The following description shows certain embodiments of the present disclosure, and the scope of the present disclosure is not limited to the following embodiments. In the following description, the same reference signs indicate substantially the same contents.

First Embodiment

A light source apparatus according to a first embodiment converts a wavelength of a fundamental wave by a nonlinear optical crystal and generates a light having a wavelength shorter than that of the fundamental wave. In the first embodiment, a light source apparatus used as an illumination light source of a semiconductor inspection apparatus such as a photomask is described, but the use of the light source apparatus is not limited to an inspection apparatus.

Figure 1:
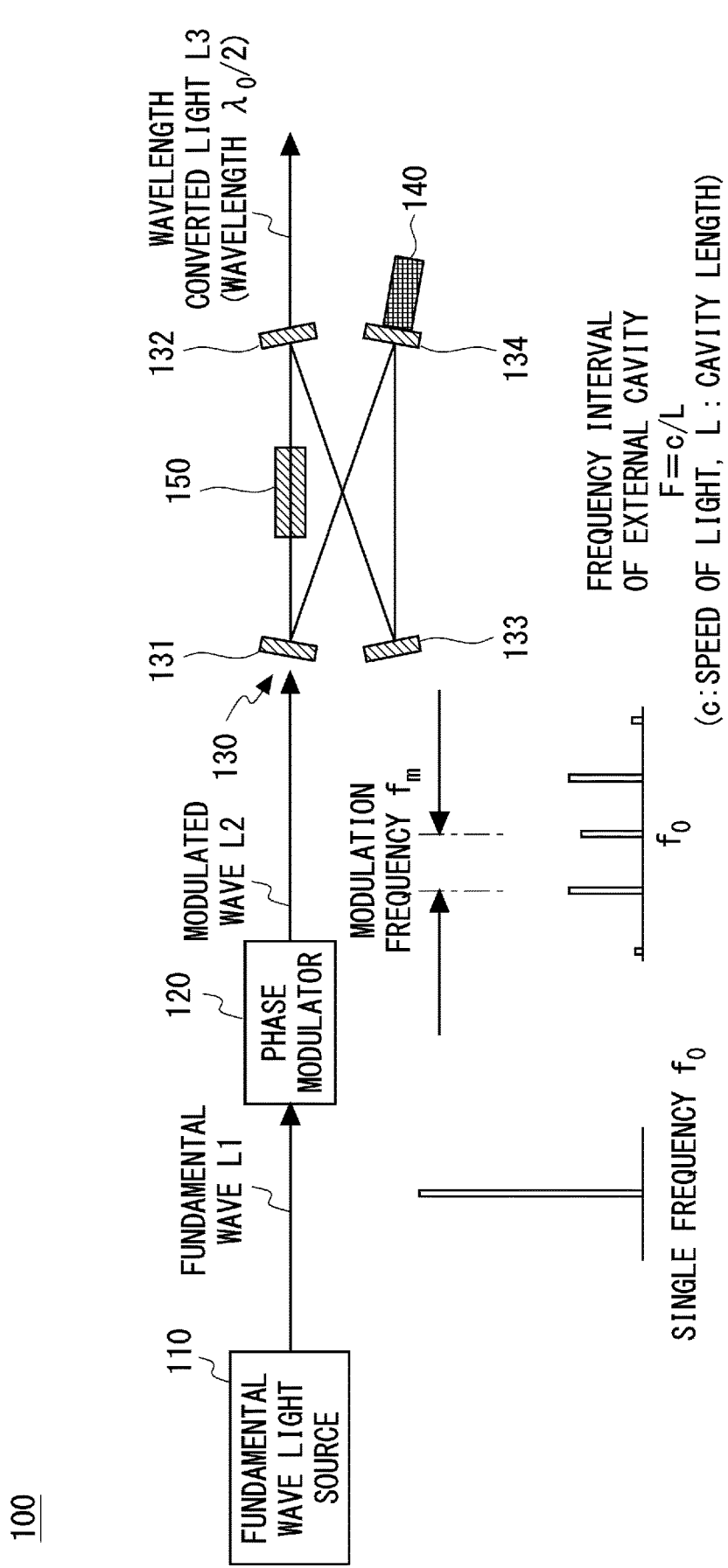
FIG. 1 shows a configuration of a light source apparatus according to a first embodiment.

A light source apparatus 100 according to a first embodiment will be described with reference to FIG. 1. FIG. 1 shows a configuration of the light source apparatus 100 according to the first embodiment. The light source apparatus 100 includes a fundamental wave light source 110, a phase modulator 120, an external cavity 130, an actuator 140, and a nonlinear optical crystal 150.

The fundamental wave light source 110 generates a fundamental wave L1 which is a continuous oscillation laser beam. The fundamental wave light source 110 is a single frequency CW (Continuous Wave) laser light source. Assume that a frequency of the fundamental wave L1 is $f_0$ and a wavelength thereof is $\lambda_0$. A phase of the fundamental wave L1 is modulated by the phase modulator 120 described later, and then the fundamental wave L1 is made incident on the nonlinear optical crystal 150 described later.

The phase modulator 120 is disposed between the fundamental wave light source 110 and the external cavity 130 described later. As the phase modulator 120, for example, an electro-optical phase modulator in which an electrode is provided on a nonlinear optical crystal such as $LiNBO_3$, KTP ($KTiOPO_4$), BBO ($\beta$-$BaB_2O_4$) or the like may be used.

The phase modulator 120 modulates the fundamental wave L1 by a modulation frequency $f_m$, which is an integer multiple of a resonance frequency interval F of the external cavity 130 described later, to generate a modulated wave L2. A sideband wave (also referred to as a sideband light) is generated by modulating the phase of the fundamental wave L1.

When the phase modulation is performed in wavelength conversion using an external cavity, an output of the wavelength converted light decreases, because commonly the sideband waves do not satisfy the resonance condition of the external cavity. Therefore, in the light source apparatus 100, the modulation frequency $f_m$ is made to match the resonance frequency interval F of the external cavity 130 or an integer multiple thereof to satisfy the resonance condition (L=λ× integer) of all the sideband waves. In this way, the sideband waves can also resonate in the external cavity 130 and contribute to the wavelength conversion. As a result, the light source apparatus 100 can generate a short wavelength light that is equivalent to a case where a single frequency light is input to the nonlinear optical crystal 150.

Figure 2:
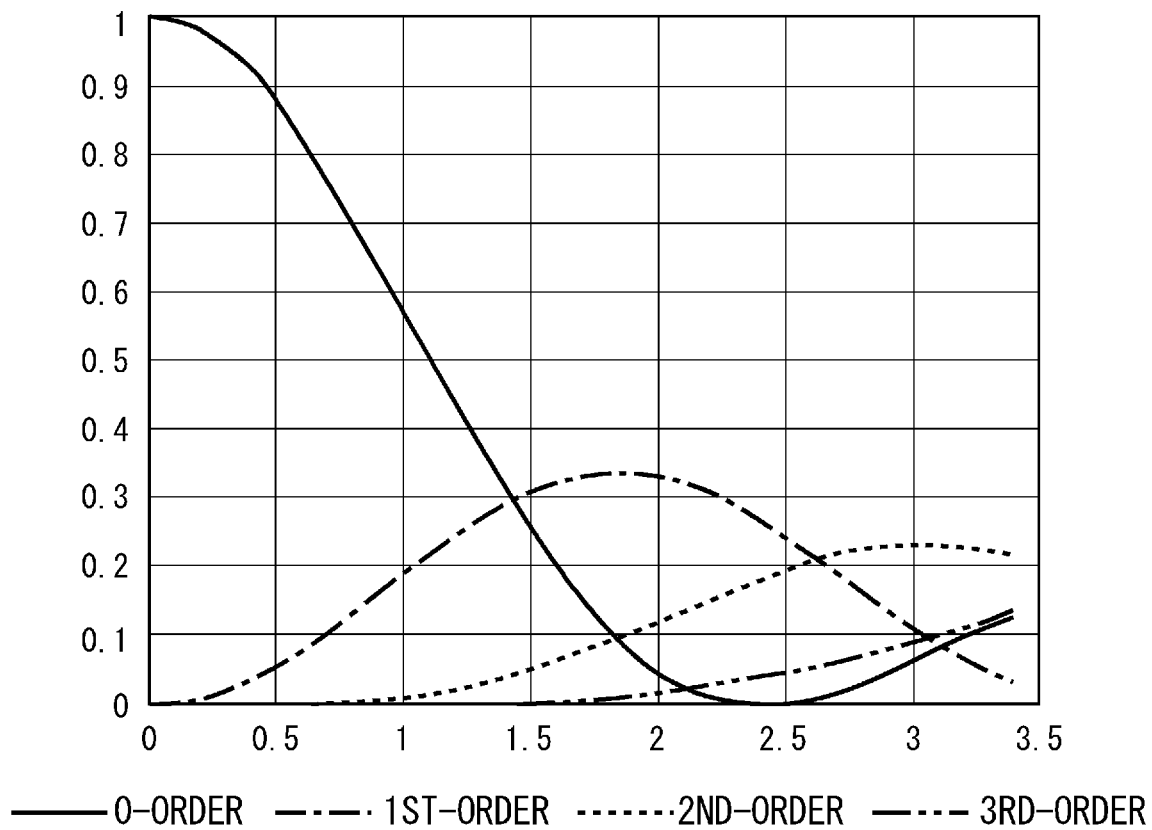
FIG. 2 is a graph showing a relationship between a light intensity and a degree of modulation of 0-order to 2nd-order spectral components of a modulated wave.

FIG. 2 is a graph showing a relationship between a degree of modulation (also referred to as modulation depth) R of the phase modulator 120 and intensities of a light of 0-order to 3rd-order spectral components of the modulated wave L2. The horizontal axis represents a degree of modulation R of the phase modulator 120. The vertical axis represents the light intensity of each spectral component. The light intensity of the 0-order component of the modulated wave L2 is indicated by the solid line, the light intensity of the 1st-order component of the modulated wave L2 is indicated by the dashed-and-dotted line, the light intensity of the 2nd-order component of the modulated wave L2 is indicated by the dotted line, and the light intensity of the 3rd-order component of the modulated wave L2 is indicated by the dashed-and-double-dotted line. The 0-order spectral component of the modulated wave L2 is a component having the same frequency $f_0$ as that of the fundamental wave L1, and is also referred to as a carrier wave. The 1st, 2nd, and 3rd components of the modulated wave L2 represent sideband waves.

Referring to FIG. 2, for example, when the degree of modulation β is 3 radians, the light intensities of the 1st-order to 3rd-order components of the modulated wave L2 are sufficiently large. In such a case, the modulated wave L2 includes at least three lower sideband waves (−3rd to −1st order components), a carrier wave (0-order component), and three upper sideband waves (+1st to +3rd-order components), and is a multimode light including a light of seven or more kinds of wavelengths in total. The number of the sideband lights varies according to the degree of modulation β that depends on high-frequency power used for the phase modulation, the size of the crystal, etc. The phase modulator 120 can generate a multimode light including a total of 3 to 10 lights.

FIGS. 3 to 6 are graphs showing the light intensities of the spectral components of the modulated wave L2 when the degree of modulations R are 1.0, 1.5, 2.0, and 3.0, respectively. The vertical axis represents the light intensity, and the horizontal axis represents the order of each spectral component.

Figure 3:
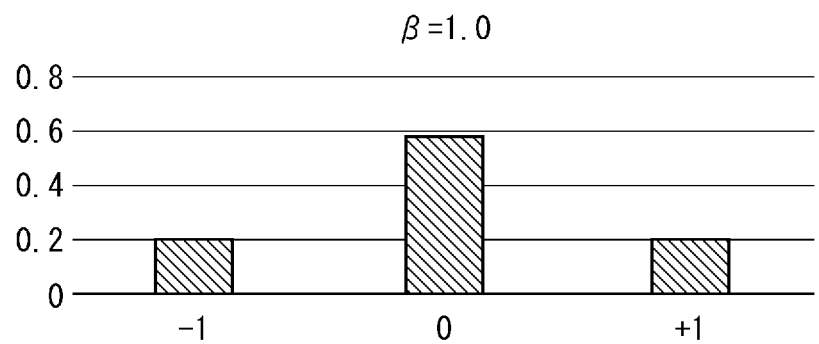
FIG. 3 is a graph showing the light intensity of each spectral component of a modulated wave when the degree of modulation is 1.0.
Figure 4:
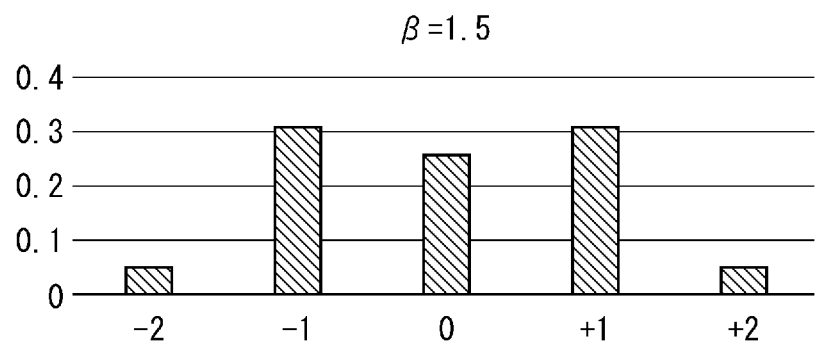
FIG. 4 is a graph showing the light intensity of each spectral component of the modulated wave when the degree of modulation is 1.5.
Figure 5:
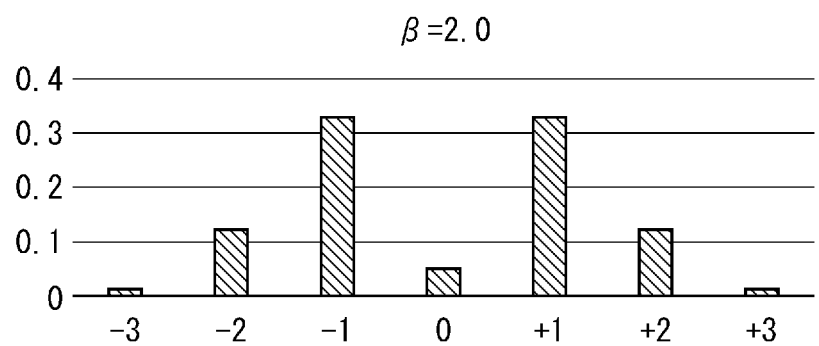
FIG. 5 is a graph showing the light intensity of each spectral component of the modulated wave when the degree of modulation is 2.0.
Figure 6:
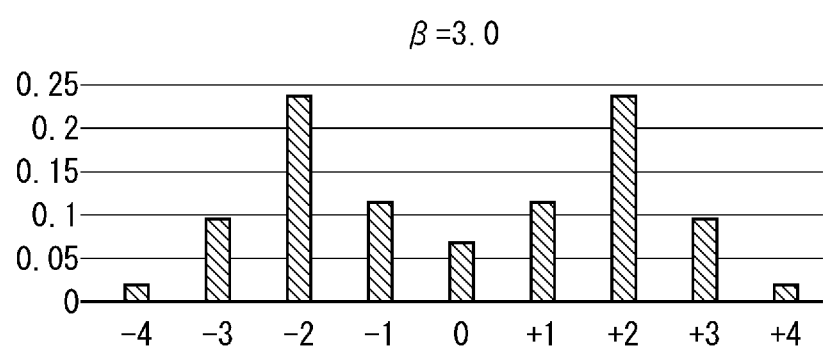
FIG. 6 is a graph showing the light intensity of each spectral component of the modulated wave when the degree of modulation is 3.0.

Referring to FIG. 3, when the degree of modulation R is 1.0, the modulated wave L2 includes a carrier wave and (±1) order sideband waves, and becomes a multimode light including a light of three kinds of wavelengths. Referring to FIG. 4, when the degree of modulation β is 1.5, the modulated wave L2 includes a carrier wave, (±1) order sideband waves, and (±2) order sideband waves, and becomes a multimode light including a light of a total of five kinds of wavelengths. Referring to FIG. 5, when the degree of modulation β is 2.0, the modulated wave L2 includes a carrier wave, (±1) order sideband waves, (±2) order sideband waves, and (±3) order sideband waves, and becomes a multimode light including a light of a total of seven kinds of wavelengths. Referring to FIG. 6, when the degree of modulation R is 3.0, the modulated wave L2 includes a carrier wave, (±1) order sideband waves, (±2) order sideband waves, (±3) order sideband waves, and (±4) order sideband waves, and becomes a multimode light including a light of a total of nine kinds of wavelengths.

The phase modulator 120 may, for example, modulate the fundamental wave L1 with a degree of modulation β of 0.5 radians or more. By setting the degree of modulation β to 0.5 radians or more, the phase modulator 120 can generate (±1) order sideband waves. Further, by setting the degree of modulation to 1 radian or more, the phase modulator 120 can generate (±1) order sideband waves and (±2) order sideband waves.

Not only the carrier wave of the modulated wave L2 but also the sideband waves resonate in the external cavity 130 described later. The reason for this is explained below. As described above, the relationship $f_m = F \times N$ (N is an integer of 2 or more) is established between the modulation frequency $f_m$ of the phase modulator 120 and the resonance frequency interval F of the external cavity 130 which will be described later. The frequencies of the sideband waves included in the modulated wave L2 are $f_0 \pm N \times F$, $f_0 \pm 2N \times F$, and $f_0 \pm 3N \times F$ respectively. Therefore, when the fundamental wave L1 having the frequency $f_0$ resonates in the external cavity 130, the sideband waves of the modulated wave L2 also resonate in the external cavity 130. Thus, the efficiency of wavelength conversion in the light source apparatus 100 hardly changes compared to the related art without the phase modulator 120.

Figure 7:
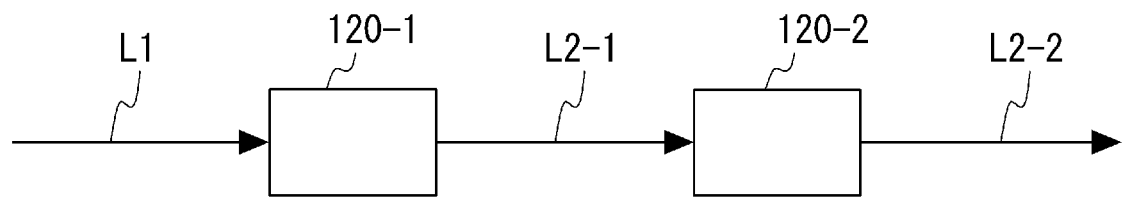
FIG. 7 is a block diagram showing a configuration example of a phase modulator according to the first embodiment.

There may be a plurality of the phase modulators 120. FIG. 7 is a schematic diagram showing a configuration including two phase modulators 120-1 and 120-2. The phase modulator 120-1 modulates the fundamental wave L1 to generate a modulated wave L2-1. The phase modulator 120-2 modulates the modulated wave L2-1 and then outputs a modulated wave L2-2.

For example, it is assumed that the degree of modulation β of the phase modulator 120-1 is 1.3 and the degree of modulation R of the phase modulator 120-2 is also 1.3. In such a case, the phase modulators 120-1 and 120-2 generate three spectral components from one spectral component of a light (see FIG. 2).

It is assumed that the phase modulator 120-1 and the phase modulator 120-2 have modulation frequencies $f_m$ different from each other. For example, the modulation frequency $f_m$ of the phase modulator 120-1 is three times the modulation frequency $f_m$ of the phase modulator 120-2.

Figure 8:
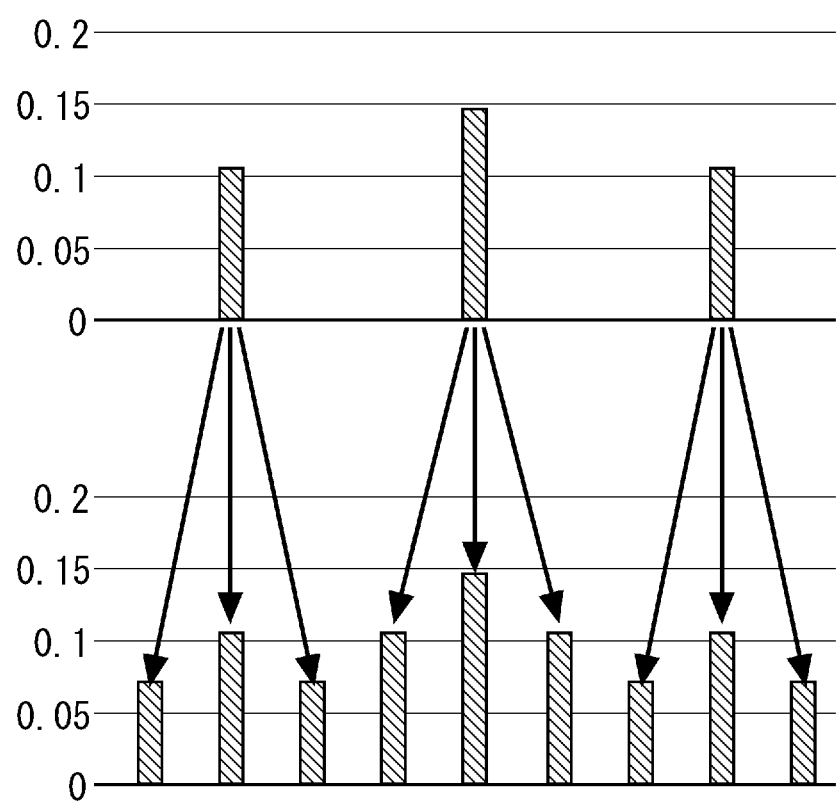
FIG. 8 is a schematic diagram showing an operation example of the phase modulator according to the first embodiment.

FIG. 8 is a schematic diagram showing an overview of the operation of the phase modulator 120-1 and the phase modulator 120-2. The first graph from the top of FIG. 8 shows a power spectrum of the modulated wave L2-1 output by the phase modulator 120-1. The second graph from the top of FIG. 8 shows a power spectrum of the modulated wave L2-2 output by the phase modulator 120-2.

The phase modulator 120-1 modulates the fundamental wave L1 at a modulation frequency $f_m$ of, for example, three times the modulation frequency $f_m$ of the phase modulator 120-2, which is in the subsequent stage of the phase modulator 120-1. Next, the phase modulator 120-2 generates three spectral components from each of the three spectral components of the modulated wave L2-1, and generates a modulated wave L2-2 including a total of nine kinds of lights. By including a plurality of phase modulators 120 in this manner, the light source apparatus 100 can generate more sideband lights from the fundamental wave L1. The number of phase modulators 120 is not limited to two.

Referring back to FIG. 1, the description is continued. The external cavity 130 is composed of a plurality of (e.g., four) optical mirrors 131 to 134. The optical mirrors 131 to 134 are, for example, concave mirrors or planar mirrors. The modulated wave L2 is guided to the external cavity 130 via the optical mirror 131. The modulated wave L2 is repeatedly reflected by the optical mirror 131 to 134 in order. The nonlinear optical crystal 150, which will be described later, is disposed in the external cavity 130.

The actuator 140 for adjusting the length of the external cavity 130 (hereinafter referred to as an external cavity length L) is attached to one (e.g., the optical mirror 134) of the optical mirrors 131 to 134. By the control apparatus not shown appropriately controlling the actuator 140, the resonance of the external cavity 130 is maintained.

As described above, the modulated wave L2 includes a carrier wave and sideband waves, and both the carrier wave and the sideband waves resonate in the external cavity 130. Hereinafter, a condition under which a plurality of types of lights resonate in the external cavity 130 will be described in detail.

In the case of a linear optical cavity composed of two facing mirrors, half of a wavelength λ of the resonating light matches the external cavity length L. Therefore, $\lambda = 2 \times L/N$ (N is an integer), that is, $N = (2 \times L)/\lambda$ holds. When two lights having different wavelengths $\lambda_1$ and $\lambda_2$ resonate, $(2 \times L)/\lambda_1 = N$ and $(2 \times L)/\lambda_2 = M$ (N and M are integers different from each other) hold. Therefore, for the frequencies $v_1$ and $v_2$ of lights, $v_1 = c/\lambda_1 = (c \times N)/(2 \times L)$ and $v_2 = c/\lambda_2 = (c \times M)/(2 \times L)$ hold (c represents a speed of light).

The difference $v_1 - v_2$ between the frequencies is $\{(c \times N)/(2 \times L) - (c \times M)/(2 \times L)\} = \{(N-M) \times c\}/(2 \times L)$ [Hz]. Here, a minimum value of the difference between the frequencies $v_1 - v_2$ (hereinafter referred to as Δv) indicates the above-described cavity frequency interval F. Since the minimum value of N−M is 1, the resonance frequency interval $F = \Delta v = c/(2 \times L)$ holds.

Therefore, for the lights that resonate, all of the lights whose frequency difference matches an integer multiple of the resonance frequency interval $F=c/(2\times L)$ will resonate in that cavity. In the case of a ring-type cavity composed of three or more mirrors, the cavity frequency interval $F=c/L$.

As described above, the phase modulator 120 performs phase modulation at a frequency that is an integer multiple of the cavity frequency interval F. Therefore, all kinds of lights included in the modulated wave L2 resonate in the external cavity 130.

FIG. 9 shows a specific numerical example of the resonance frequency v in the ring-type external cavity 130. When the cavity length L is 0.6 m, the cavity frequency interval $F=(c/L)$ is $5\times10^8$ [Hz]. The light having a frequency different from the frequency of the resonating light (e.g., $3\times10^{14}$) is (−1) times the resonance frequency interval F (e.g., $(3\times10^{14})-(5\times10^8)$ [Hz]) or (+1) times the resonance frequency interval F (e.g., $(3\times10^{14})+(5\times10^8)$ [Hz]) also resonates in this external cavity 130.

Referring back to FIG. 1, the description is continued. The nonlinear optical crystal 150 is disposed inside the external cavity 130 and generates a light having a wavelength shorter than that of the fundamental wave L1 (hereinafter referred to as a wavelength converted light L3). The nonlinear optical crystal 150 is disposed between the optical mirror 131 and the optical mirror 132 in this example. The wavelength converted light L3 includes a wavelength component of $\lambda_0/2$. Here, $\lambda_0$ represents the wavelength of the fundamental wave L1, i.e., the wavelength of the carrier wave included in the modulated wave L2, as described above. The nonlinear optical crystal 150 is, for example, a BBO ($\beta$-BaB$_2$O$_4$) crystal, a CLBO (CsLiB$_6$O$_1$) crystal, or an LBO (LiB$_3$O$_5$) crystal, and may generate a light having a wavelength of 400 nm or less.

Figure 10:
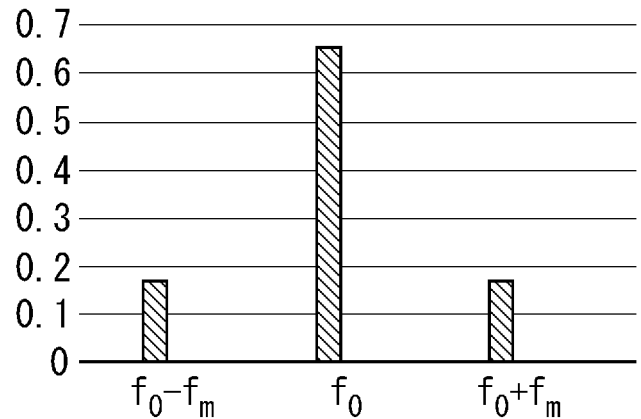
FIG. 10 shows a power spectrum of a modulated wave and a power spectrum of a wavelength converted light when the degree of modulation is 0.9.
Figure 10:
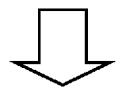
Figure 10:
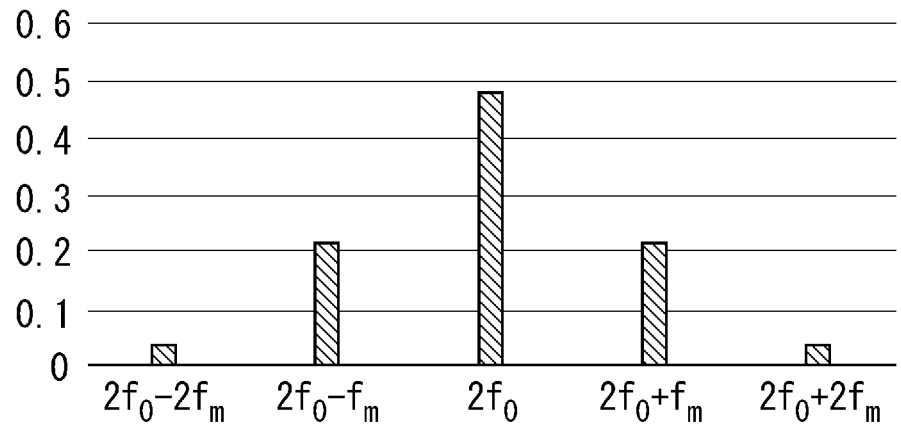
Figure 11:
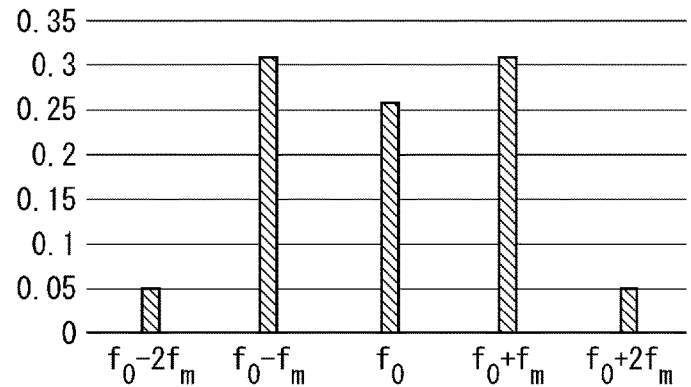
FIG. 11 shows the power spectrum of the modulated wave and the power spectrum of the wavelength converted light when the degree of modulation is 1.5.
Figure 11:
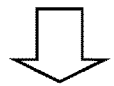
Figure 11:
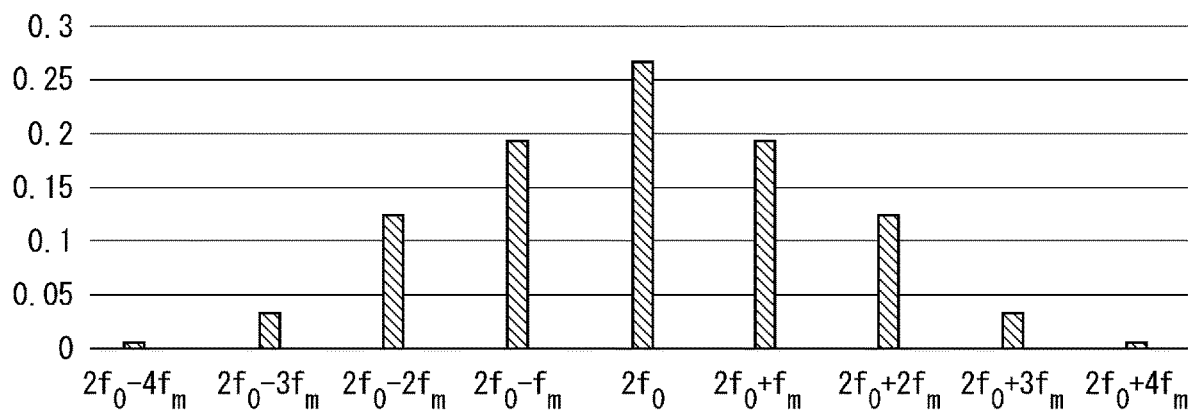

FIGS. 10 and 11 are schematic diagrams showing the power spectra of the wavelength converted light L3. The first graph from the top in FIG. 10 shows the power spectrum of the modulated wave L2 when the degree of modulation $\beta$ of the phase modulator 120 is 0.9. When the phase of the fundamental wave L1 is modulated with a degree of modulation 0.9, a modulated wave L2 including three frequency components (e.g., $f_0$, $f_0+f_m$ and $f_0-f_m$) is obtained. When a wavelength of such a modulated wave L2 is converted by the nonlinear optical crystal 150, the wavelength converted light L3 including five frequency components (e.g., $2f_0$, $2f_0+f_m$, $2f_0-f_m$, $2f_0+2f_m$, and $2f_0-2f_m$) is obtained.

The first graph from the top in FIG. 11 shows the power spectrum of the modulated wave L2 when the degree of modulation $\beta$ of the phase modulator 120 is 1.5. When the phase of the fundamental wave L1 is modulated with a degree of modulation $\beta$ 1.5, a modulated wave L2 including five frequency components (e.g., $f_0$, $f_0+f_m$, $f_0-f_m$, $f_0+2f_m$, $f_0-2f_m$) is obtained. When a wavelength of such a modulated wave L2 is converted by the nonlinear optical crystal 150, a wavelength converted light L3 including nine frequency components (e.g., $2f_0$, $2f_0+f_m$, $2f_0-f_m$, $2f_0+2f_m$, $2f_0-2f_m$, $2f_0+3f_m$, $2f_0-3f_m$, $2f_0+4f_m$, and $2f_0-4f_m$) is obtained.

Next, the effect of the light source apparatus according to the first embodiment will be described. As described above, Japanese Unexamined Patent Application Publication No. 2007-163893 points out that a refractive index distribution is generated in a nonlinear optical crystal due to the action of an ultraviolet light. The inventor of the present application has found that generation of a refractive index distribution can be suppressed by generating a sideband wave in addition to a carrier wave by phase modulation and resonating all of the carrier waves and the sideband waves in an external cavity. This effect is presumed to be due to the reduced coherence between the incident light entering the nonlinear optical crystal and the generated ultraviolet light, which prevents the generation of a refractive index distribution.

Since the modulated wave L2 input to the nonlinear optical crystal 150 is not a single frequency light but a light including a plurality of frequency components, the optical spectral width (band) is substantially enlarged. This reduces the coherence of both the modulated wave L2 and the wavelength converted light L3, making it difficult to form a transmission-type diffraction grating based on the interference effect in the nonlinear optical crystal 150. As a result, the nonlinear optical crystal 150 can generate the wavelength converted light L3 with higher output power.

Next, a specific example in which the fundamental wave light source 110 generates a fundamental wave L1 with a wavelength of 532 nm and the wavelength converted light L3 is generated, which is an ultraviolet light with a wavelength of 266 nm, will be described. The nonlinear optical crystal 150 is a BBO crystal with a length of 10 mm, and the external cavity 130 is a ring-type cavity with a cavity length of 400 mm. In such a case, the optical path length=390+ 10×(refractive index 1.672 of BBO)=406.72 mm, and the cavity frequency interval $F=c/L=737.1$ MHz. When the phase of the fundamental wave L1 is modulated with a modulation frequency $f_m=737.1$ MHz and a degree of modulation of 1 radian or more, a sideband light is generated at every frequency interval of 737.1 MHz. As the phase modulator 120, an electro-optical phase modulator in which an electrode is provided on a nonlinear optical crystal such as LiNBO$_3$, KTP (KTiOPO$_4$), BBO ($\beta$-BaB$_2$O$_4$) or the like is used.

When all of the lights before being subjected to the phase modulation and the sideband lights satisfy the resonance condition of the external cavity, the intensity of the light incident on the nonlinear optical crystal 150 does not depend on the depth (the degree of modulation) of the phase modulation. Therefore, the intensity of the light emitted from the nonlinear optical crystal 150 is equivalent to the intensity of the light when the phase modulation is not performed (in the case of a single frequency).

When the fundamental wave has a single frequency, the spectral width is extremely narrow (e.g., 100 kHz or less) and the interference is extremely strong (e.g., the over-interference distance is several kilometers). On the other hand, when frequency modulation is performed at a frequency interval $f=737.1$ MHz and, for example, ten sideband lights are generated, the spectral width becomes 737.1×9=6.6 GHz. Therefore, the phase-modulated light has an over-interference distance of about 45 mm, which is a weakly interfering light. This prevents the transmission-type grating based on the interference effect from developing in the nonlinear optical crystal 150 such as a BBO crystal.

Figure 16:
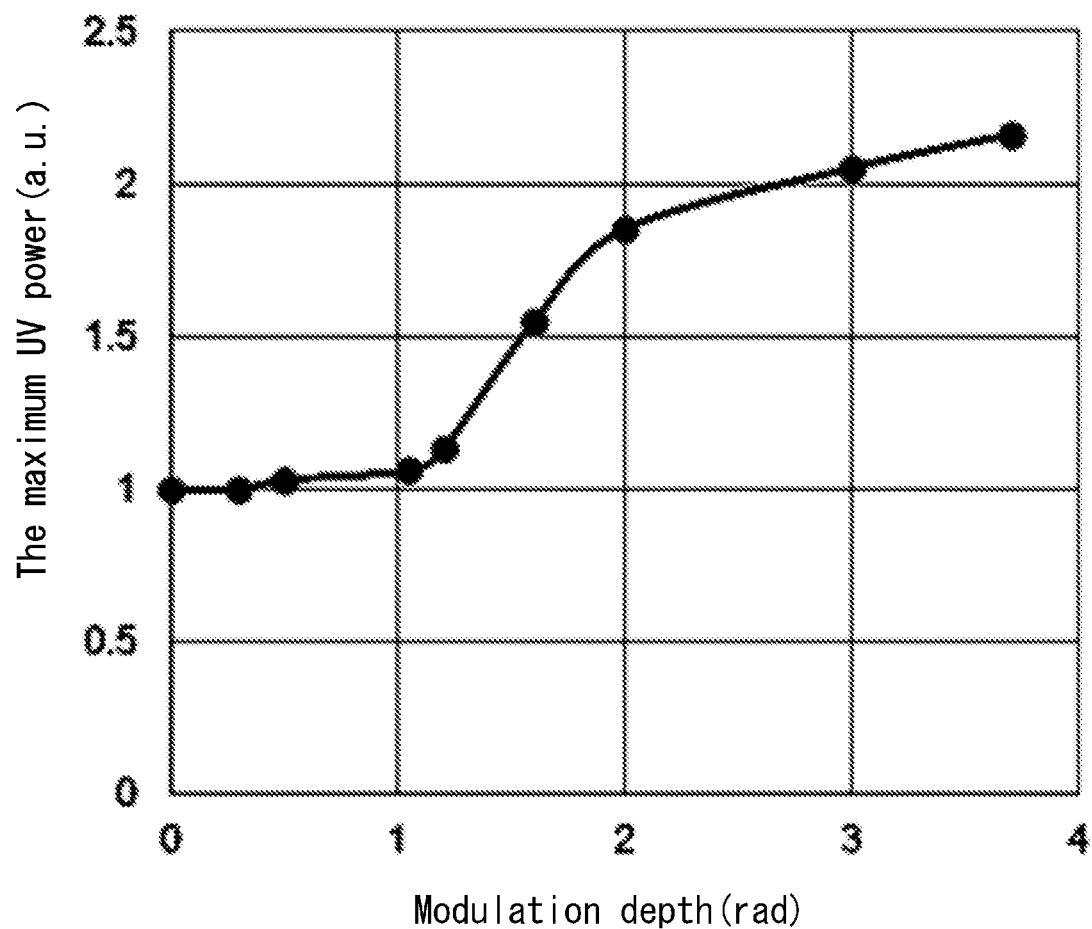
FIG. 16 is a graph showing the relationship between a modulation depth and a maximum ultraviolet power.

Since the phase matching tolerance of the BBO crystal is about 100 GHz, the wavelength conversion efficiency is not lowered. The inventor found that a limiting value of the UV light output due to the development of the transmission-type grating increases by a factor of two when about seven sideband lights are generated (See FIG. 16).

According to the light source apparatus of the first embodiment, the degradation of the crystal in the nonlinear optical crystal can be suppressed, and the short wavelength light of higher output power can be generated. Since the generation of a reflected light due to the degradation of the nonlinear optical crystal can be suppressed, more stable a short wavelength light can be generated by stabilizing the fundamental wave. Furthermore, according to the light source apparatus of the first embodiment, short wavelength light with low speckle noise can be generated by reducing the interference of an ultraviolet light.

Modified Example 1

Figure 12:
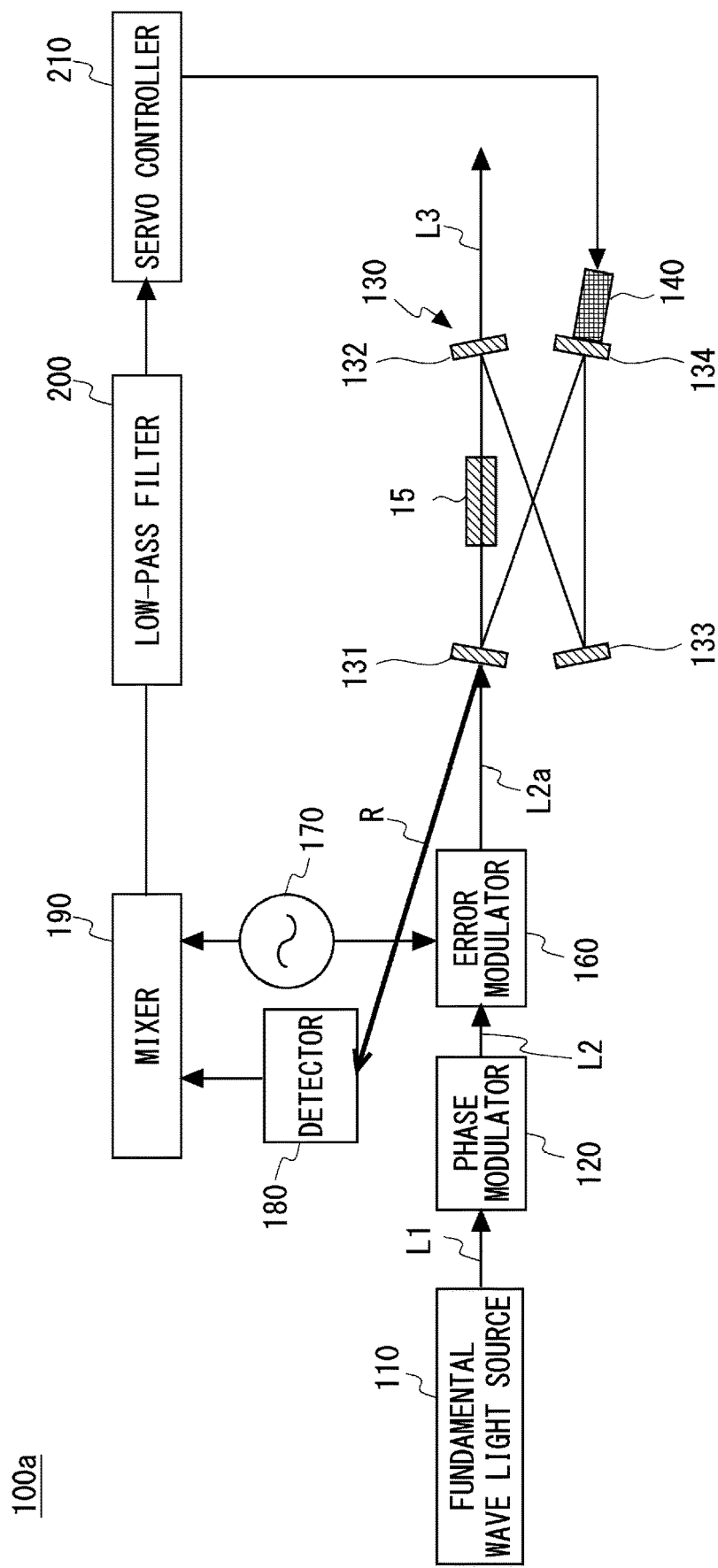
FIG. 12 shows a configuration of a light source apparatus according to a modified example.

In addition to the phase modulator 120 described above, a light source apparatus 100a according to a modified example 1 includes an error modulator that generates an error signal for controlling a cavity length. FIG. 12 shows a configuration of the light source apparatus 100a. The light source apparatus 100a further includes an error modulator 160, an RF (Radio Frequency) oscillator 170, a detector 180, a mixer 190, a low-pass filter 200, and a servo controller 210 in addition to the configuration of the light source apparatus 100 described above.

Like the phase modulator 120, the error modulator 160 is disposed between the fundamental wave light source 110 and the external cavity 130 and is used to generate an error signal in the FM sideband method. The error modulator 160 further modulates the modulated wave L2 modulated by the phase modulator 120 and outputs a modulated wave L2a. Here, the error modulator 160 modulates a phase of the modulated wave L2 by using a modulation signal $f_n$ output from the RF oscillator 170. The modulation signal $f_m$ used for phase modulation performed by the phase modulator 120 and the modulation signal $f_n$ used for phase modulation performed by the error modulator 160 have frequencies different from each other. The modulated wave L2a emitted from the error modulator 160 is guided to the external cavity 130.

The detector 180 detects a reflected light R of the modulated wave L2a sent to the external cavity 130. The mixer 190 multiplies a detection signal of the reflected light R by the modulation signal $f_n$ of the RF oscillator 170. When a multiplication result is passed through the low-pass filter 200, an error signal used for controlling the external cavity length L is generated. The servo controller 210 drives the actuator 140 by using the error signal.

Figure 13:
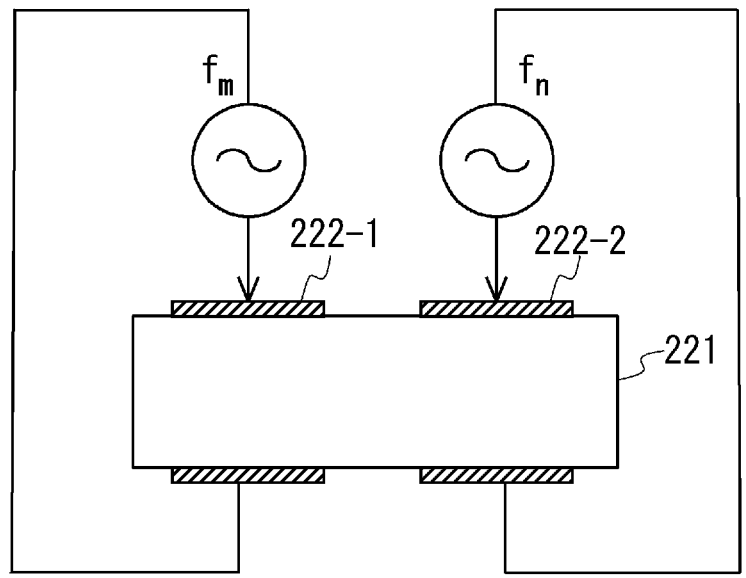
FIG. 13 shows a first configuration example of a phase modulator according to a modified example.
Figure 14:
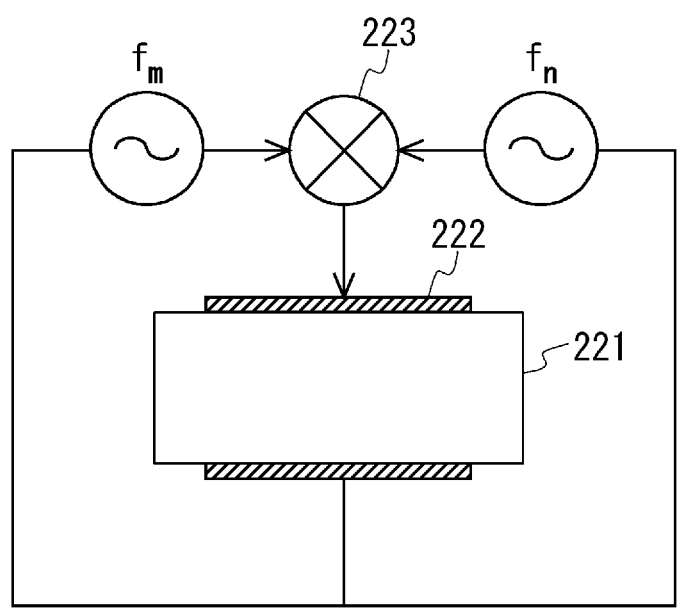
FIG. 14 shows a second configuration example of a phase modulator according to the modified example.

Here, the light source apparatus 100a may include one phase modulator 220 that has the functions of both the phase modulator 120 and the error modulator 160. FIGS. 13 and 14 show examples of the configuration of the phase modulator 220 serving as both phase modulation means and error modulation means.

FIG. 13 shows a first configuration example of the phase modulator 220 according to the modified example 1. The phase modulator 220 shown in FIG. 13 includes an electro-optic crystal 221 and electrodes 222-1 and 222-2. A modulation signal for applying an electric field to the electro-optic crystal 221 is input to the electrodes 222-1 and 222-2. The modulation signal $f_m$ used in the phase modulator 120 is input to the electrode 222-1. The modulation signal $f_n$ used in the error modulator 160 is input to the electrode 222-2. A light emitted from the electro-optic crystal 221 includes components of both the sideband light and a light used for error modulation.

FIG. 14 shows a second configuration example of the phase modulator 220 according to the modified example 1. The phase modulator 220 shown in FIG. 14 includes an electro-optic crystal 221, an electrode 222, and a mixer 223. The mixer 223 multiplies the modulation signal $f_m$ used in the phase modulator 120 by the modulation signal $f_n$ used in the error modulator 160. An output of the mixer 125 is input to the electrode 222, and an electric field is applied to the electro-optical crystal 221. A light emitted from the electro-optic crystal 221 includes components of both the sideband light and a light used for error modulation.

According to the light source apparatus of the modified example 1, the cavity length of the external cavity can be appropriately controlled by using the FM sideband method. The phase modulator used for generating the sideband light can also include error modulation means. Note that it is an aspect of the present disclosure that the modulation frequency of the phase modulator coincides with the longitudinal mode spacing of the laser light source generating the fundamental wave. In such a case, even if the laser light source cannot maintain the single frequency oscillation and oscillates in a longitudinal multimode, since all the modes continue to resonate in the external cavity, high power ultraviolet light can be generated stably.

Inspection Apparatus

Figure 15:
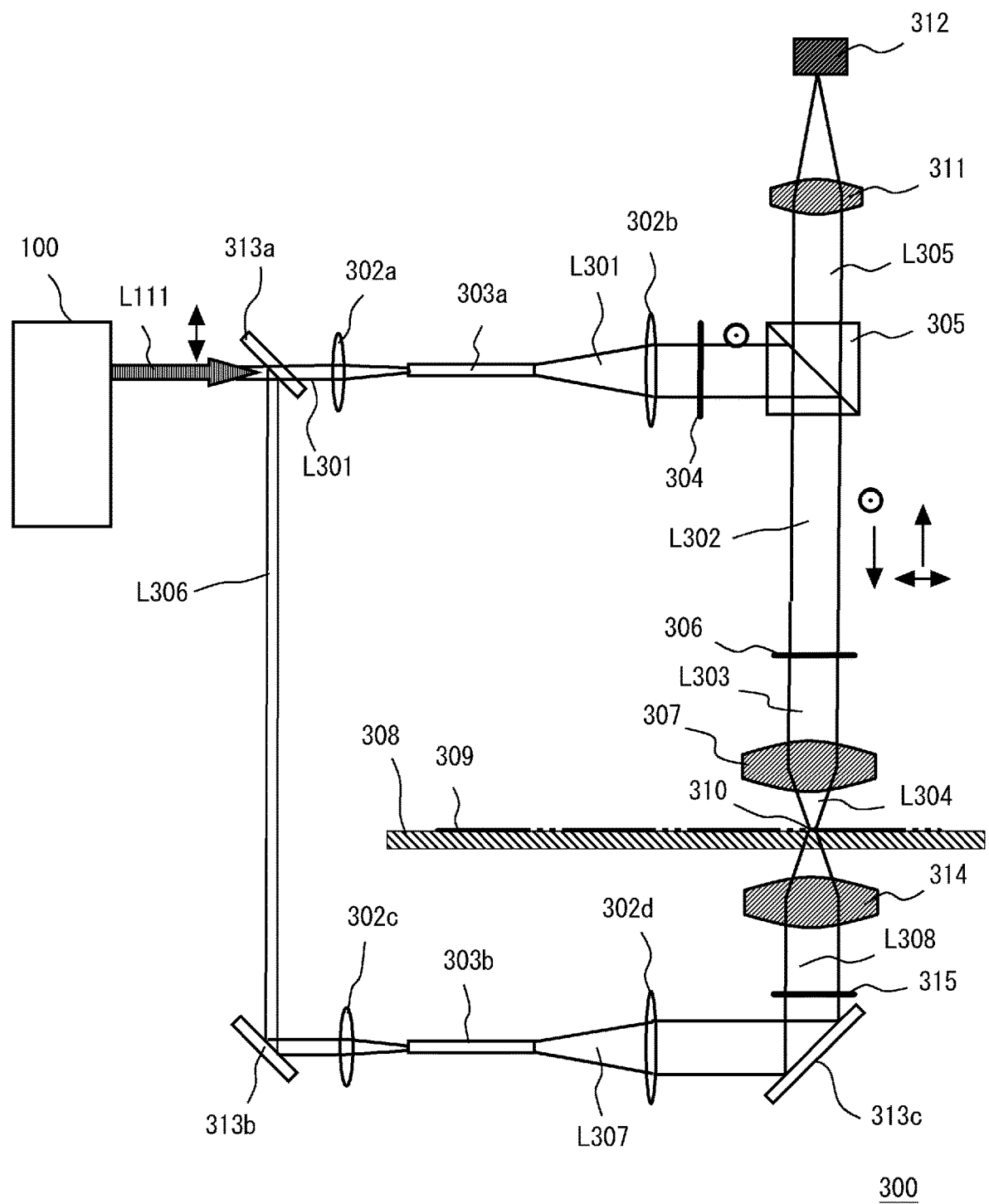
FIG. 15 shows a configuration example of an inspection apparatus according to the first embodiment.

Next, a configuration of an inspection apparatus using the light source apparatus 100 according to the first embodiment will be described with reference to FIG. 15. FIG. 15 shows an overall configuration of an inspection apparatus 300. The inspection apparatus 300 shown in FIG. 15 is an inspection apparatus of a mask used in an exposure process of semiconductor manufacturing. A photomask to be inspected is mainly used for lithography using DUV light of 193 nm as an exposure wavelength. Obviously, an object to be inspected is not limited to a photomask.

As shown in FIG. 15, the inspection apparatus 300 includes a light source apparatus 100, lenses 302a to 302d, uniformizing optical systems 303a and 303b, a λ/2 wavelength plate 304, a polarization beam splitter 305, a λ/4 wavelength plate 306, an objective lens 307, an imaging lens 311, a two-dimensional photodetector 312, a half mirror 313a, mirrors 313b to 313c, a condenser lens 314, and a 3λ/4 wavelength plate 315.

The light source apparatus 100 generates an illumination light L111 which is a P wave. The illumination light L111 corresponds to the wavelength converted light L3 in FIG. 1. Alternatively, the wavelength converted light L3 may be further made incident on a wavelength conversion element to use the generated wavelength converted light as an illumination light. The illumination light L111 is branched into two illumination lights by the half mirror 313a. Here, the illumination light L111 transmitted through the half mirror 313a becomes a laser beam for reflective illumination L301, and the illumination light L111 reflected by the half mirror 313a becomes a laser beam for trans-illumination L306.

The laser beam for reflective illumination L301 is focused by the lens 302a and enters the uniformizing optical system 303a. For example, a rod-type integrator is suitable for the uniformizing optical system 303a.

The laser beam for reflective illumination L301 having a spatially uniform intensity distribution is emitted from the uniformizing optical system 303a. The laser beam for reflective illumination L301 passes through the lens 302b and passes through the λ/2 wavelength plate 304, whereby the polarization direction is rotated by 90 degrees, so that the laser beam for reflective illumination L301 becomes an S wave. The laser beam for reflective illumination L301, which has become an S wave, enters the polarization beam splitter 305 and is reflected downward in FIG. 15 as a laser beam for reflective illumination L302. The laser beam for reflective illumination L302 passes through the λ/4 wavelength plate 306 to become a circularly polarized laser beam for reflective illumination L303. The laser beam for reflective illumination L303 illuminates an observation area 310 in a pattern surface 309 of the mask 308 through the objective lens 307. The above system is an illumination system called reflective illumination. The reflected light reflected by the pattern surface 309 of the mask 308 and advancing upward becomes a laser beam L304.

On the other hand, the laser beam for trans-illumination L306 supplied from the light source apparatus 100 is reflected by the mirror 313b. The laser beam for trans-illumination L306 reflected by the mirror 313b is focused by a lens 302c and made incident on the uniformizing optical system 303b. When the laser beam for trans-illumination L306 advances inside the uniformizing optical system 303b, the laser beam for trans-illumination L307 having a spatially uniform intensity distribution is emitted. The laser beam for trans-illumination L307 passes through the lens 302d, is reflected by the mirror 313c, passes through the ¾ wavelength plate 315, and becomes a circularly polarized laser beam for trans-illumination L308. The laser beam for trans-illumination L308 passes through the condenser lens 314 and irradiates the observation area 310 in the pattern surface 309 of the mask 308. The above system is an illumination system called trans-illumination. The transmitted light passing through the mask 308 and advancing upward becomes the laser beam L304.

The laser beam L304 reflected from the mask 308 or the laser beam L304 transmitted through the mask 308 passes through the objective lens 307, passes through the λ/4 wavelength plate 306, and returns to linear polarization. The laser beam L304 advancing upward becomes a P wave whose polarization direction is orthogonal to that of the laser beam for trans-illumination L302 that advances downward, and transmits through the polarization beam splitter 305. As a result, like the laser beam L305, the laser beam passes through the imaging lens 311 and strikes the two-dimensional photodetector 312. Thus, the two-dimensional photodetector 312 captures an image of the mask 308 illuminated by the wavelength converted light. The observation area 310 is magnified and projected on the two-dimensional photodetector 312 for pattern inspection. As the two-dimensional photodetector 312, an imaging apparatus such as a CCD sensor, a CMOS sensor, or a TDI sensor can be used.

As described above, the light source apparatus 100 suppresses the degradation of the crystal in the nonlinear optical crystal, and can stably generate a short wavelength light with higher output power. Therefore, defects can be detected with high accuracy, and the inspection speed can be improved.

According to the first embodiment, in the light source apparatus 100 in which wavelengths of laser beams are shortened by using a nonlinear optical crystal, it is possible to output a stable and high power light with a short wavelength. In the light source apparatus 100 for semiconductor inspection, if the amount of lights applied to the object to be measured varies even slightly, the measurement data varies and an accurate inspection result cannot be obtained. Output stability over a long period of time is also required. The light source apparatus according to the first embodiment can stabilize the amount of laser beams. Therefore, by illuminating an object to be inspected with the wavelength converted light L3 from the light source apparatus 100, stable inspections can be performed. In addition, according to the first embodiment, the interference noise in the inspection apparatus can be reduced.

Although the embodiment of the present disclosure has been described above, the present disclosure includes appropriate variations that do not impair its purpose and advantages, and is not limited by the embodiments described above.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the present disclosure.

The following claims particularly point out certain combinations and sub-combinations regarded as novel and non-obvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. A light source apparatus, comprising:
    a fundamental wave light source configured to generate a fundamental wave, the fundamental wave being a continuous oscillation laser beam;
    an external cavity including a plurality of optical mirrors;
    a nonlinear optical crystal installed inside the external cavity and configured to generate a light with a wavelength shorter than that of the fundamental wave; and
    at least one phase modulation means disposed between the fundamental wave light source and the external cavity and configured to modulate the fundamental wave by a modulation frequency of an integer multiple of a resonance frequency interval of the external cavity.

2. The light source apparatus according to claim 1, wherein
    the modulation frequency is equal to a longitudinal mode spacing of a laser generating the fundamental wave.

3. The light source apparatus according to claim 1, wherein
    a degree of modulation by the at least one phase modulation means is 0.5 radians or more.

4. The light source apparatus according to claim 1, wherein
    the light source apparatus includes a plurality of the at least one phase modulation means including modulation frequencies different from each other.

5. The light source apparatus according to claim 1, further comprising:
    error modulation means for generating an error signal in an FM sideband method disposed between the fundamental wave light source and the external cavity.

6. The light source apparatus according to claim 5, further comprising:
    a phase modulator serving as both the phase modulation means and the error modulation means.

7. The light source apparatus according to claim 1, wherein
    the nonlinear optical crystal is any one of a BBO crystal, a CLBO crystal, and an LBO crystal, and configured to generate the light with a wavelength of 400 nm or less.

8. An inspection apparatus comprising:
the light source apparatus according to claim 1,
wherein a sample to be inspected is irradiated with the light generated by the light source apparatus.

\* \* \* \* \*